(12) United States Patent
Kim et al.

(10) Patent No.: US 11,784,271 B2
(45) Date of Patent: Oct. 10, 2023

(54) PATTERN-GLASS AND SOLAR LIGHT POWER GENERATING MODULE COMPRISING SAME

(71) Applicants: POSCO, Pohang-si (KR); RESEARCH INSTITUTE OF INDUSTRIAL SCIENCE & TECHNOLOGY, Pohang-si (KR)

(72) Inventors: Tae-Won Kim, Pohang-si (KR); Tae-Joon Park, Pohang-si (KR); A-Rong Kim, Pohang-si (KR); Ji-Sang Park, Seoul (KR); Kun-Hoon Baek, Seoul (KR)

(73) Assignees: POSCO CO., LTD, Pohang-si (KR); RESEARCH INSTITUTTE OF INDUSTRIAL SCIENCE & TECHNOLOGY, Pohang-si (KR)

( * ) Notice: Subject to any disclaimer, the term of this patent is extended or adjusted under 35 U.S.C. 154(b) by 66 days.

(21) Appl. No.: 16/636,124

(22) PCT Filed: Aug. 17, 2018

(86) PCT No.: PCT/KR2018/009434
§ 371 (c)(1),
(2) Date: Feb. 3, 2020

(87) PCT Pub. No.: WO2019/035677
PCT Pub. Date: Feb. 21, 2019

(65) Prior Publication Data
US 2020/0161491 A1    May 21, 2020

(30) Foreign Application Priority Data
Aug. 18, 2017    (KR) .................. 10-2017-0105067

(51) Int. Cl.
*H01L 31/054* (2014.01)
*H02S 20/26* (2014.01)
(Continued)

(52) U.S. Cl.
CPC .......... *H01L 31/0543* (2014.12); *G02B 5/045* (2013.01); *H01L 31/055* (2013.01); *H01L 31/0547* (2014.12); *H02S 20/26* (2014.12)

(58) Field of Classification Search
CPC ............. H01L 31/0543; H01L 31/0547; H01L 31/055; H01L 31/02; H01L 31/042;
(Continued)

(56) References Cited

U.S. PATENT DOCUMENTS

| 2006/0250818 | A1 | 11/2006 | Tsuda |
| 2008/0271776 | A1 | 11/2008 | Morgan |
| 2011/0109964 | A1* | 5/2011 | Kim ...................... G02B 30/36 359/463 |

(Continued)

FOREIGN PATENT DOCUMENTS

| CN | 102388459 A | 3/2012 |
| CN | 102986039 A | 3/2013 |

(Continued)

OTHER PUBLICATIONS

Extended European Search Report dated Jun. 9, 2020 issued in European Patent Application No. 18846644.5.
(Continued)

*Primary Examiner* — Michael Y Sun
(74) *Attorney, Agent, or Firm* — Morgan, Lewis & Bockius LLP

(57) ABSTRACT

A pattern-glass, according to one embodiment of the present invention, can comprise: a base plate unit coupled to a support body; and a pattern unit provided in the base plate unit, and comprising a transmission area to which light transmits while an angle, formed between an entrance direction and a deviation direction in a light path formed by the
(Continued)

light emitted from a light source, forms an obtuse angle range, and a reflection area in which an angle, formed between an entrance direction and a deviation direction in a light path of vision light transferred to an observer, forms an acute angle range so as to have reflectivity bigger than that in the transmission area.

6 Claims, 11 Drawing Sheets

(51) Int. Cl.
 *G02B 5/04* (2006.01)
 *H01L 31/055* (2014.01)
(58) Field of Classification Search
 CPC ............... H01L 31/02327; H02S 20/26; G02B 5/045; Y02B 10/10; Y02E 10/52
 See application file for complete search history.

(56) References Cited

U.S. PATENT DOCUMENTS

| | | |
|---|---|---|
| 2011/0205744 A1 | 8/2011 | Kim |
| 2011/0210273 A1 | 9/2011 | Kurt et al. |
| 2012/0012163 A1 | 1/2012 | Yu et al. |
| 2013/0025674 A1 | 1/2013 | Rinko |
| 2013/0098443 A1 | 4/2013 | Azumada |
| 2014/0104689 A1 | 4/2014 | Padiyath et al. |
| 2014/0316742 A1 | 10/2014 | Sun et al. |
| 2015/0171252 A1 | 6/2015 | Lee |
| 2016/0072430 A1 | 3/2016 | Gilbert et al. |

FOREIGN PATENT DOCUMENTS

| | | | |
|---|---|---|---|
| JP | H01-263382 | A | 10/1989 |
| JP | 2003-302508 | A | 10/2003 |
| JP | 2010-525582 | A | 7/2010 |
| JP | 4565948 | B2 | 10/2010 |
| JP | 2012-508961 | A | 4/2012 |
| JP | 5558568 | B2 | 6/2014 |
| JP | 2015-507817 | A | 3/2015 |
| JP | 2017-031600 | A | 2/2017 |
| JP | 2017-046496 | A | 3/2017 |
| JP | 2017046496 | A * | 3/2017 |
| KR | 10-2006-0066092 | A | 6/2006 |
| KR | 10-2010-0065548 | A | 6/2010 |
| KR | 10-1047439 | B1 | 7/2011 |
| KR | 10-1307015 | B1 | 9/2013 |
| KR | 10-2014-0017632 | A | 2/2014 |
| KR | 10-1506116 | B1 | 3/2015 |
| KR | 10-1700379 | B1 | 1/2017 |
| KR | 10-1917533 | B1 | 11/2018 |
| WO | 2008/131561 | A1 | 11/2008 |
| WO | 2009/063822 | A1 | 5/2009 |
| WO | 2015/040288 | A1 | 3/2015 |

OTHER PUBLICATIONS

Japanese Office Action dated Mar. 30, 2021 issued in Japanese Patent Application No. 2020-508429.
International Search Report dated Nov. 26, 2018 issued in International Patent Application No. PCT/KR2018/009434 (with English translation).

* cited by examiner

[FIG.1]
(a)
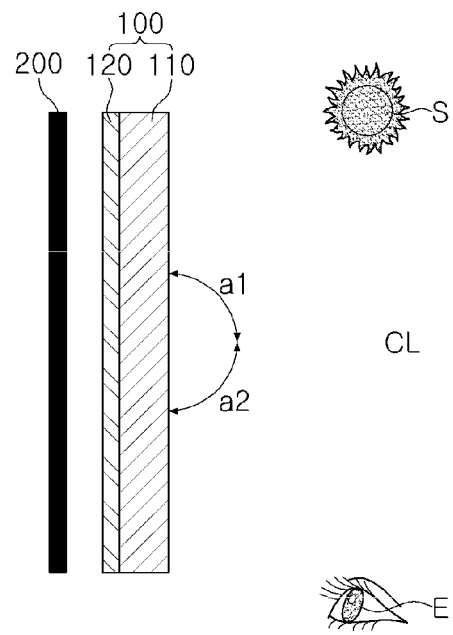
(b)
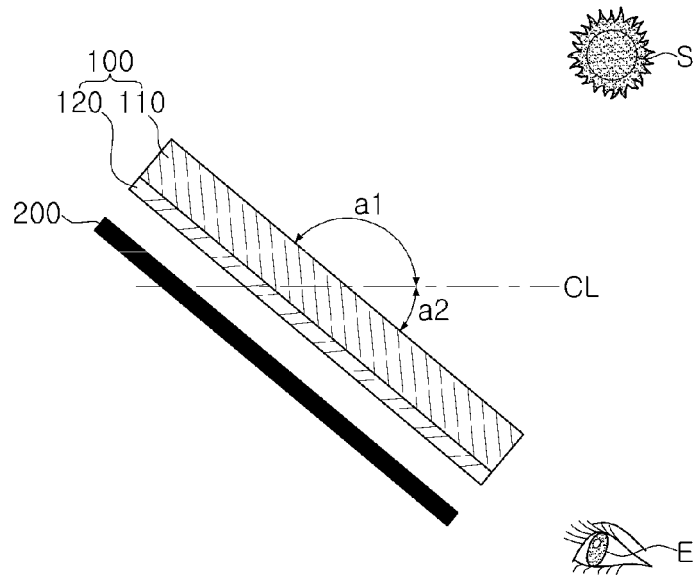

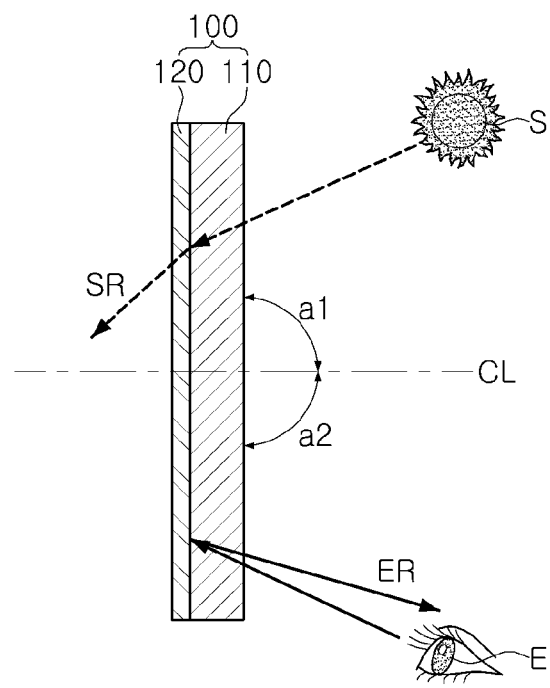
[FIG.2]

[FIG.3]
(a)
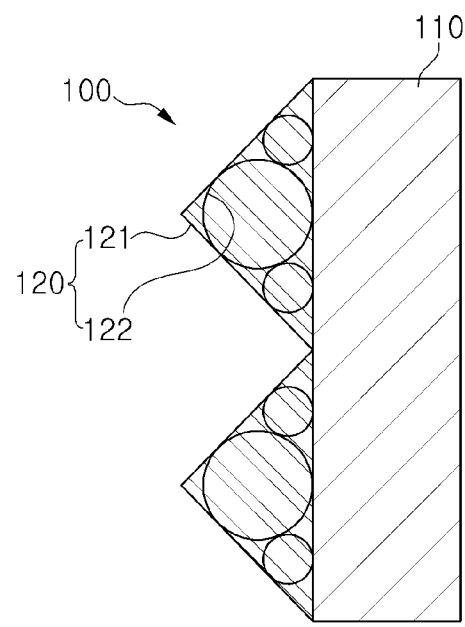
(b)
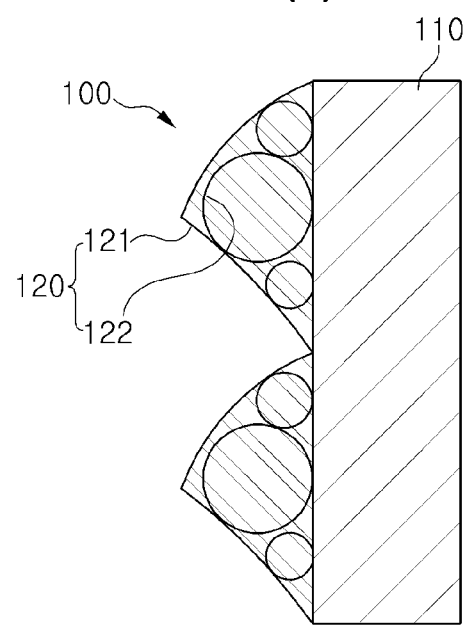

[FIG.4]
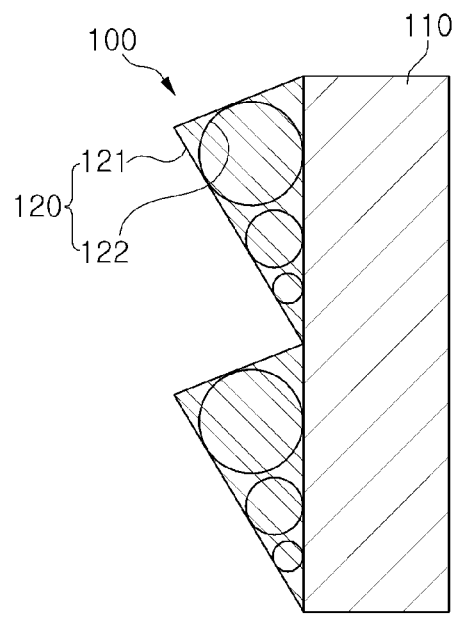
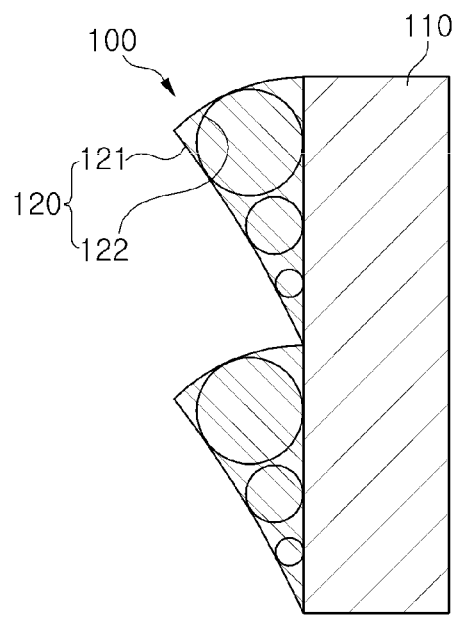

[FIG.5]
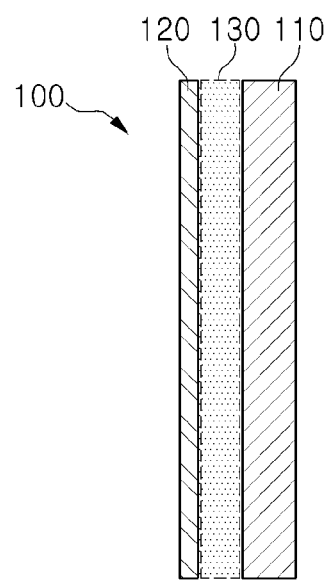
[FIG.6]
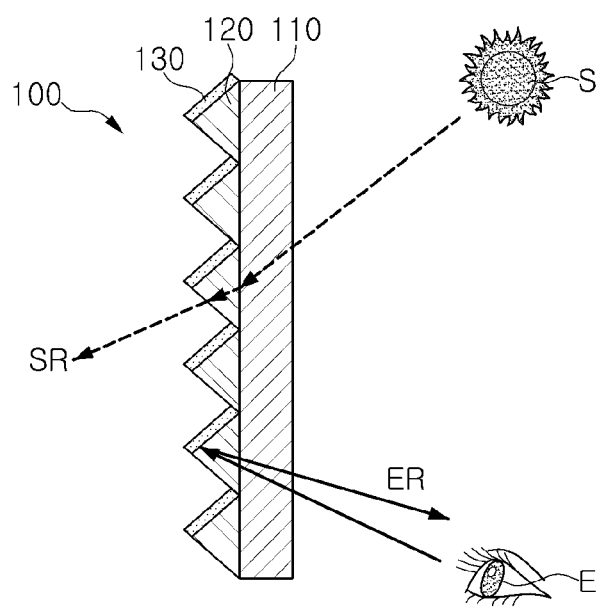

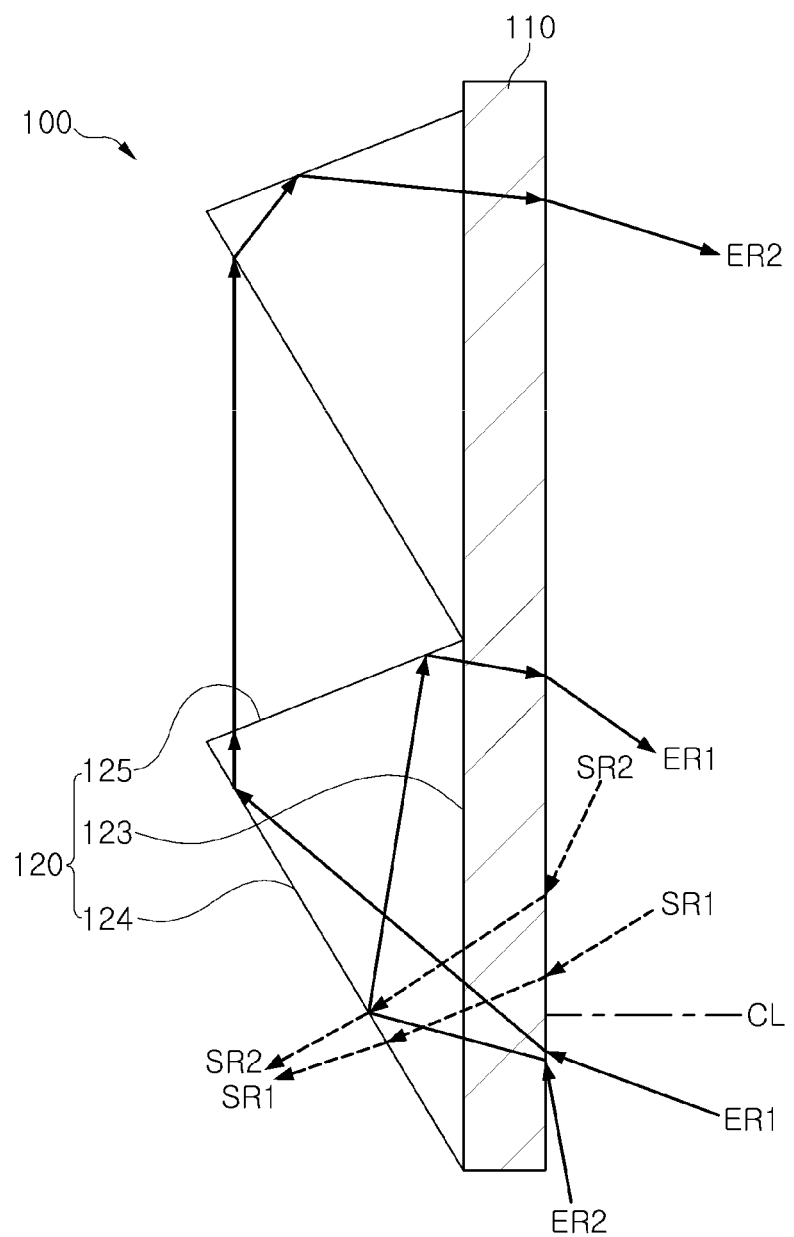
[FIG.7]

[FIG.8]
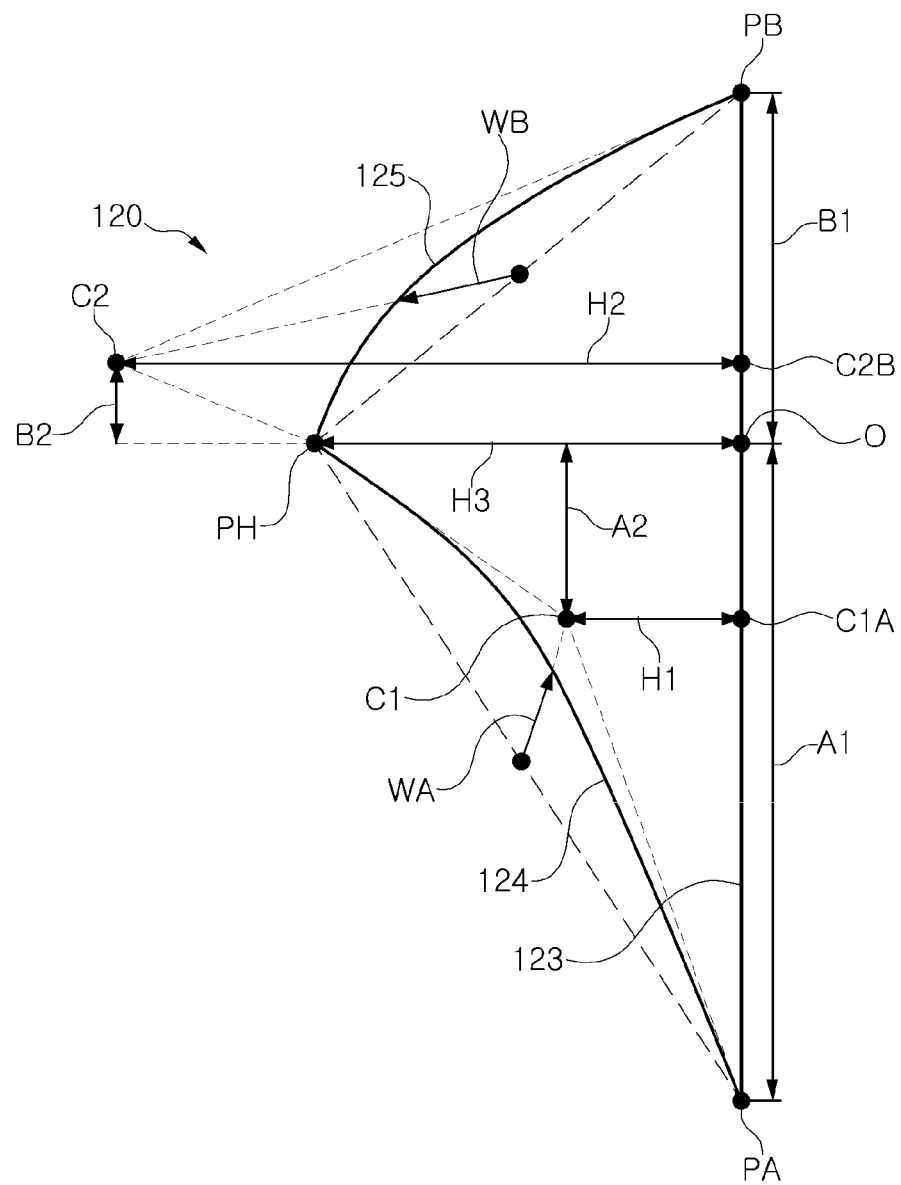

[FIG.9]
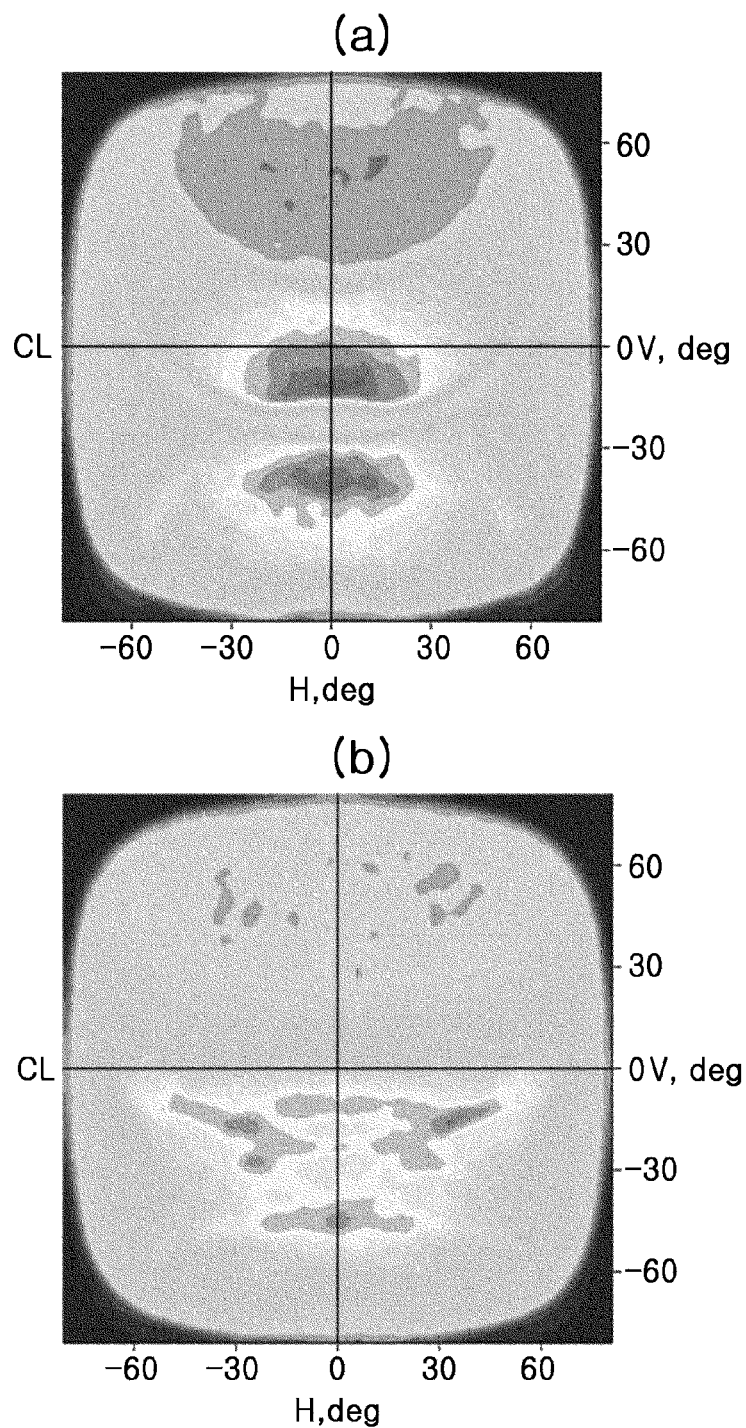

[FIG.10]
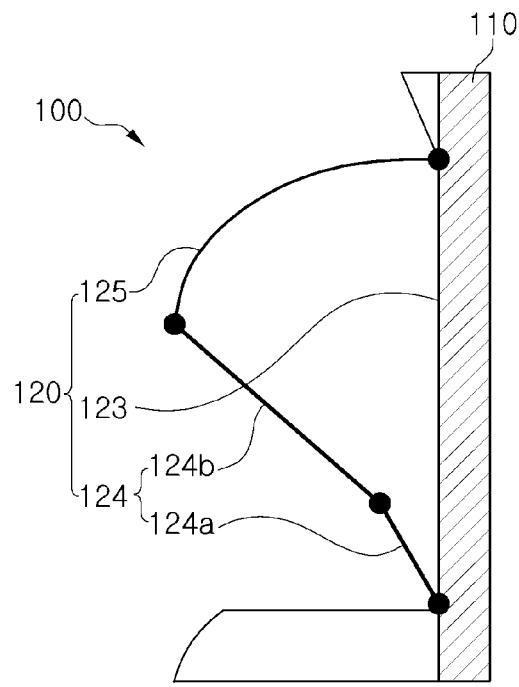
[FIG.11]
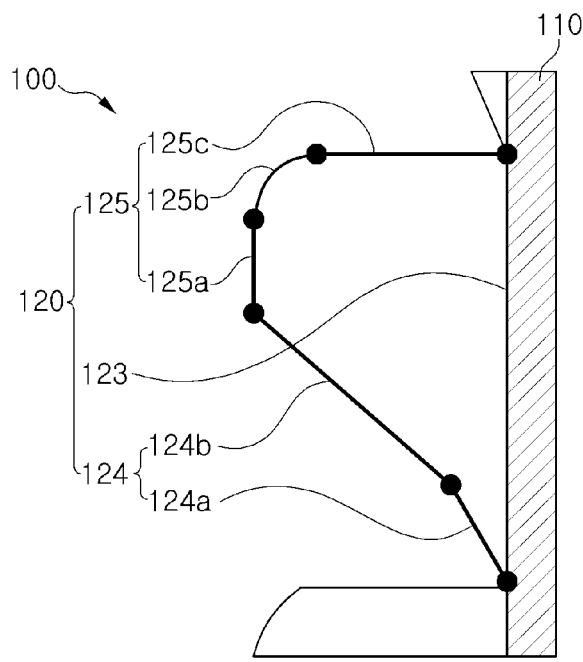

[FIG.12]
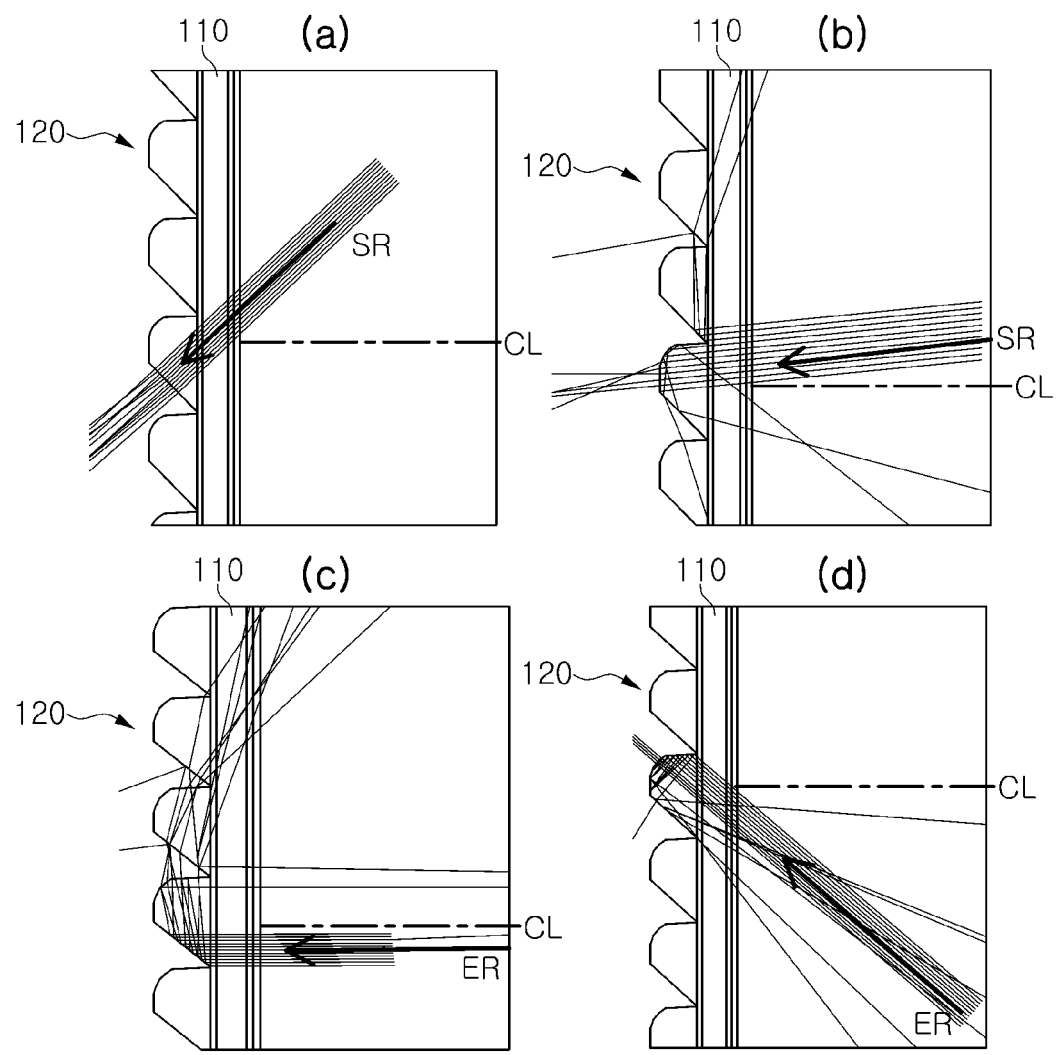

[FIG.13]
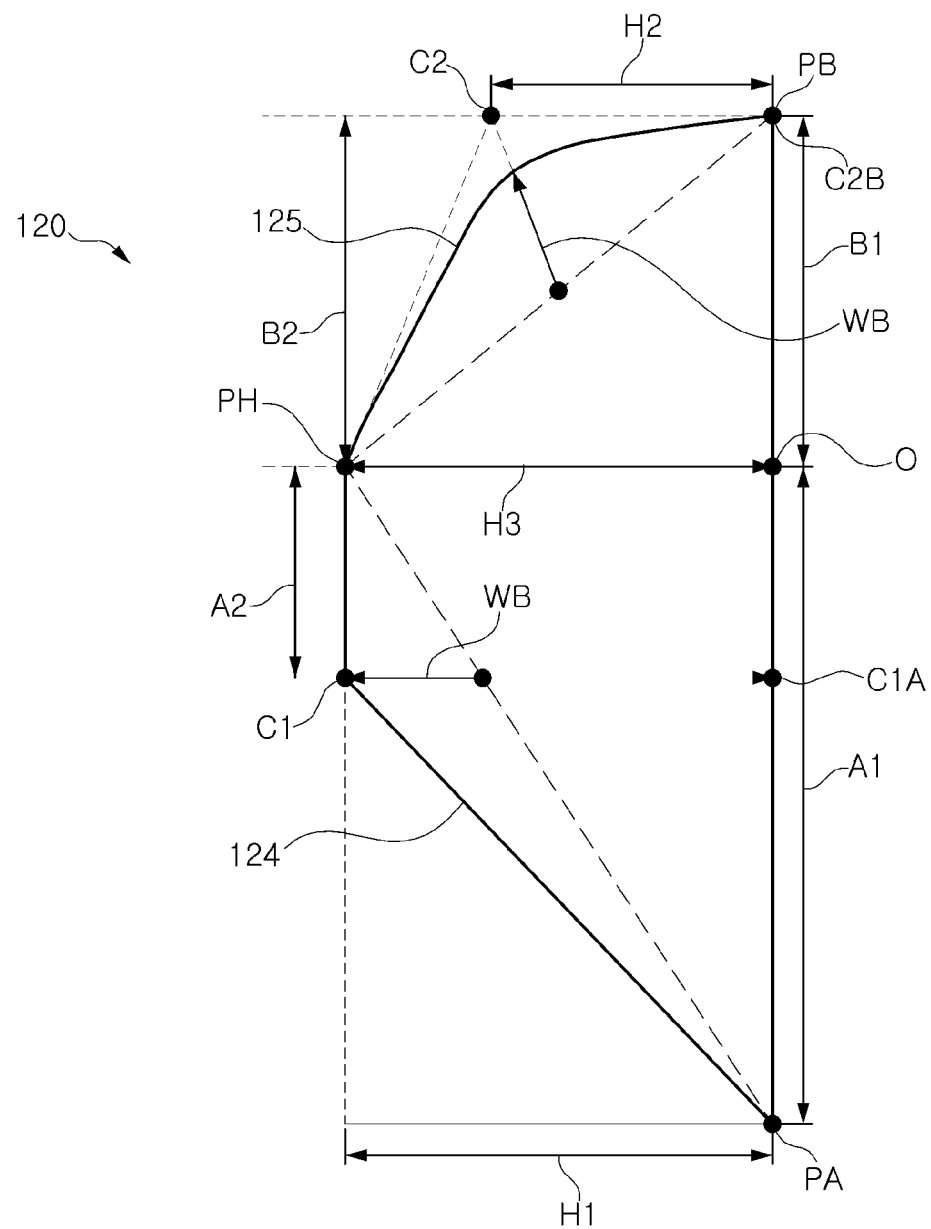

PATTERN-GLASS AND SOLAR LIGHT POWER GENERATING MODULE COMPRISING SAME

CROSS-REFERENCE OF RELATED APPLICATIONS

This application is the U.S. National Phase under 35 U.S.C. § 371 of International Patent Application No. PCT/KR2018/009434, filed on Aug. 17, 2018, which in turn claims the benefit of Korean Application No. 10-2017-00105067, filed on Aug. 18, 2017, the entire disclosures of which applications are incorporated by reference herein.

TECHNICAL FIELD

The present disclosure relates to patterned-glass and a solar light power generating module including the same.

BACKGROUND ART

If the solar module is applied to an outer wall of a building and transparent protective glass is used, the incident efficiency of sunlight reflected from above the outer wall is significantly increased, but there may be an aesthetic problem for an observer observing below the outer wall.

As a solution to the problem described above, a method of applying a color to the transparent protective glass may be considered. However, in this case, the aesthetic problem may be improved by increasing concealment with the color, but another problem may occur that the incident efficiency of the sunlight (transmittance of the protective glass) is lowered thereby.

Meanwhile, to increase concealment for observers while preventing such a decrease in transmittance with respect to sunlight, a film having a light shielding partition structure is attached to the transparent protective glass. Thus, the method of solving the aesthetic problem may be considered by securing the transmittance in a forward direction while increasing the concealment in a lateral direction.

However, the method described above also has a limitation in which transmittance of sunlight with respect to an incidence angle in a lateral direction, rather than an incidence angle in a forward direction, is inevitable.

That is, while a path of sunlight is not changed, a portion of entering sunlight is transmitted, and a portion is shielded. Accordingly, there is a limitation in which the same transmittance is applied without dividing an area requiring shielding and an area not requiring shielding of sunlight.

Accordingly, there is a limitation in which transmittance is lowered by the unnecessary increase in the shielding rate in a region requiring collection of sunlight, and a shielding rate is lowered by the unnecessary increase in the transmittance of the vision light transferred to an observer.

Therefore, to solve the problem described above, the research on a pattern glass and a solar power generating module including the same has been required.

DISCLOSURE

Technical Problem

An aspect of the present disclosure may provide a pattern-glass and a solar light power generating module including the same, transmittance is increased by preventing the unnecessary increase in a shielding rate in a region requiring collection of light emitted from a light source, and a shielding rate is increased by preventing an unnecessary increase in transmittance of vision light transferred to an observer.

Technical Solution

According to an aspect of the present disclosure, a pattern-glass includes a base plate unit coupled to a support body, and a pattern unit provided in the base plate unit, and comprising a transmission area to which light transmits while an angle, formed between an entrance direction and a deviation direction in a light path formed by the light emitted from a light source, forms an obtuse angle range, and a reflection area in which an angle, formed between an entrance direction and a deviation direction in a light path of vision light transferred to an observer, forms an acute angle range so as to have reflectivity bigger than that in the transmission area.

The pattern unit of the pattern-glass according to an embodiment of the present disclosure may be formed to have a prism pattern of which at least one surface is a curved surface.

The pattern unit in the pattern-glass according to an embodiment of the present disclosure may include a microtubule formed of an elastic material, provided in an outer surface membrane forming a prism pattern and a region surrounded by the outer surface membrane and the base plate unit, and provided with a filling fluid in a gap with the outer surface membrane.

In the microtubule of the pattern-glass according to an embodiment of the present disclosure, an inflow fluid having the same properties as the filling fluid may be provided therein to flow, and a supply pressure of the inflow fluid may be adjusted and the inflow fluid is supplied to deform a shape of a curved surface of the outer surface membrane.

The microtubule of the pattern-glass according to an embodiment of the present disclosure may be provided with a plurality of microtubules inscribed with the region surrounded by the outer surface membrane and the base plate unit.

The pattern unit in the pattern-glass according to an embodiment of the present disclosure may include a microtubule provided in an outer surface membrane forming a prism pattern in a fixed form and a region surrounded by the outer surface membrane and the base plate unit, and provided with a filling fluid in a gap with the outer surface membrane, while the microtubule may change a refractive index of an inflow fluid flowing inside and supply the inflow fluid to adjust a range of the transmission area and the reflection area.

In the pattern unit of the pattern-glass according to an embodiment of the present disclosure, an asymmetric prism pattern may be provided.

The pattern unit of the pattern-glass according to an embodiment of the present disclosure may include a connection surface portion which is coupled to the base plate unit, and in which the emitted light flows, a short side surface portion connected to the connection surface portion, forming the reflection area in a prism pattern, and provided to have a convex curved surface shape, and a long side surface portion connected to the connection surface portion and the short side surface portion, forming the transmission area in a prism pattern, and provided as a concave shape.

The long side surface portion of the pattern-glass according to an embodiment of the present disclosure may be provided to have a concave curved surface shape.

In the pattern unit of the pattern-glass according to an embodiment of the present disclosure, a shape of a prism pattern may be formed in the Bezier curve with the numerical values below.

$0.04 \geq A1 \geq 0.1$, $0.02 \geq B1 \geq 0.03$ $0 < H1 < H3$, $0 < H2 < H3$, $0.02 \geq H3 \geq 0.04$ $0 < A2 < A1$, $0 < B2 < B1$ $0 < WA \geq 1$, $0 < WB \geq 1$ In the pattern unit of the pattern-glass according to an embodiment of the present disclosure, a shape of a prism pattern may be formed in the Bezier curve with the numerical values below.

$0.1 \geq A1 \geq 0.25$, $0.03 \geq B1 \geq 0.05$ $H1 = H3$, $0 < H2 \geq H3$, $0.03 \geq H3 \geq 0.1$ $0.02 < A2 \geq 0.05$, $0 < B2 \geq B1$ $WA = 1$, $0 < WB \geq 1$ Here, H1 is a vertical distance H1 between a first control point C1, forming a shape of the long side surface portion, and the connection surface portion, H2 is a vertical distance H2 between a second control point C2, forming a shape of the short side surface portion, and the connection surface portion, and H3 is a vertical distance H3 between a first vertex PH at which the long side surface portion and the short side surface portion are in contact with each other, and the connection surface portion.

In addition, A1 is a distance A1 between an origin point O, at which a vertical line, connected to the first vertex PH, intersects the connection surface portion, and a second vertex PA at which the long side surface portion and the connection surface portion are in contact with each other, and A2 is a distance A2 between the origin point O, and a point C1A, at which a vertical line, connected to the first control point C1, intersects the connection surface portion.

In addition, B1 is a distance B1 between the origin point O, and a third vertex PB, at which the short side surface portion and the connection surface portion are in contact with each other, and B2 is a distance B2 between the origin point O, and a point C2B, at which a vertical line, connected to the second control point C2, intersects the connection surface portion.

In addition, WA is a rate WA at which a line, connecting the first vertex PH and the second vertex PA, is drawn to the first control point C1, and WB is a rate WB at which a line, connecting the first vertex PH and the third vertex PB, is drawn to the second control point C2.

In addition, H1, H2, H3, A1, A2, B1, and B2 are dimensionless numerical values of distances only including respective comparison ratios, and WA and WB are dimensionless numerical values with respect to the ratio being drawn.

In the pattern unit of the pattern-glass according to an embodiment of the present disclosure, the pattern unit may include a connection surface portion which is coupled to the base plate unit, and in which the emitted light flows, a short side surface portion connected to the connection surface portion, forming the reflection area in a prism pattern, and provided to have a convex shape, and a long side surface portion connected to the connection surface portion and the short side surface portion, forming the transmission area in a prism pattern, and provided as a concave shape, and the long side surface portion includes a first long side surface provided to have a linear shape connected to the connection surface portion, and a second long side surface which is provided to have a linear shape, connecting the first long side surface and the short side surface portion, and in which an external angle, formed with the first long side surface, forms an obtuse angle.

The entirety of the short side surface portion of the pattern-glass according to an embodiment of the present disclosure may be provided to have a curved surface shape.

Alternatively, the short side surface portion according to an embodiment of the present disclosure may include a first short side surface connected to the second long side surface, and provided to have a linear shape parallel to the connection surface portion, a second short side surface connected to the first short side surface, and provided to have a convex curved surface shape, and a third short side surface which is provided to have a linear shape, connecting the second short side surface and the connection surface portion, and in which an external angle, formed with the connection surface portion, forms an obtuse or right angle.

The pattern-glass according to an embodiment of the present disclosure may include a color portion provided in the pattern unit, and provided to adjust a transmission wavelength of light.

The color portion in the pattern-glass according to an embodiment of the present disclosure may be provided between the base plate unit and the pattern unit.

The color portion in the pattern-glass according to an embodiment of the present disclosure is only provided on one tapered surface of the pattern unit forming a reflection area in the pattern unit.

A solar light power generating module, according to another embodiment of the present invention, may include the pattern-glass, and a solar cell, which is the support body, to which the base plate unit is coupled.

The pattern-glass of the solar light power generating module according to another embodiment of the present disclosure may be provided in parallel with a building side wall provided with the solar cell.

Advantageous Effects

According to an exemplary embodiment in the present disclosure, a pattern-glass and a solar light power generating module including the same are provided, the unnecessary increase in a shielding rate is prevented in a region requiring collection of emitted light emitted by a light source to solve a transmittance decrease problem, and the unnecessary increase in transmittance of vision light transferred to an observer is prevented to increase a shielding rate.

In one aspect, the uniformity of a color observed by the vision light may be increased.

In the other aspect, a shape of a pattern unit may be changed to correspond to a vision angle change of an observer or a light emission angle change from a light source.

DESCRIPTION OF DRAWINGS

FIG. 1 is a cross-sectional view illustrating a pattern-glass and a solar light power generating module including the same according to an embodiment of the present disclosure.

FIG. 2 is a cross-sectional view illustrating a pattern-glass according to an embodiment of the present disclosure.

FIGS. 3(a) and 3(b) and 4(a) and 4(b) are cross-sectional views illustrating an embodiment in which a pattern unit includes a microtubule in a pattern-glass according to an embodiment of the present disclosure.

FIGS. 5 and 6 are cross-sectional views illustrating an embodiment in which a pattern-glass according to an embodiment of the present disclosure includes a color portion.

FIG. 7 is a cross-sectional view illustrating paths of emitted light from a light source and vision light transferred to an observer in a pattern-glass according to an embodiment of the present disclosure.

FIG. 8 is a cross-sectional view of an embodiment illustrating a pattern unit in a pattern-glass according to an embodiment of the present disclosure using a Bezier curve.

FIG. 9 illustrates a simulation result divided into a transmission area and a reflection area by a pattern-glass according to an embodiment of the present disclosure.

FIG. 10 is a cross-sectional view illustrating an embodiment in which a long side surface portion is formed to have a linear shape in a pattern-glass according to an embodiment of the present disclosure, and the entirety of a short side surface portion is a curved surface shape.

FIG. 11 is a cross-sectional view illustrating an embodiment in which a long side surface portion is formed to have a linear shape in a pattern-glass according to an embodiment of the present disclosure, and a portion of a short side surface portion includes a linear shape.

FIG. 12 is a cross-sectional view illustrating paths of emitted light from a light source or vision light transferred to an observer according to an embodiment of FIG. 11.

FIG. 13 is a cross-sectional view of another embodiment illustrating a pattern unit in a pattern-glass according to an embodiment of the present disclosure using a Bezier curve.

BEST MODE FOR INVENTION

The terminology used herein is for the purpose of describing particular embodiments only and is not intended to be limiting of the invention. Furthermore, the singular expressions herein include plural expressions unless the context clearly indicates otherwise.

Hereinafter, preferred embodiments of the present invention will be described with reference to the accompanying drawings.

The present disclosure relates to a pattern-glass 100 and a solar light power generating module including the same, unnecessary increase in a shielding rate is prevented in a region, in which collection of emitted light emitted from a light source S is required, to solve a problem of lowering the transmittance, and unnecessary increase in transmittance of vision light transferred to an observer E is prevented to increase a shielding rate.

FIG. 1 is a cross-sectional view illustrating the pattern-glass 100 according to an embodiment of the present disclosure and a solar light power generating module including the same, and, referring to FIG. 1, a solar light power generating module according to an embodiment of the present disclosure includes a pattern-glass 100, and a solar cell 200, a support body, to which a base plate unit 110 of the pattern-glass 100 is coupled.

In detail, the pattern-glass 100, as described above, is provided to increase transmittance in a region in which collection of emitted light emitted from a light source S is required, and to increase a shielding rate with respect to vision light transferred to an observer E. A detailed description thereof will be described later with reference to FIGS. 2 and 9.

In addition, the solar cell 200 is a configuration converting light energy into electrical energy, and may generate electrical energy with respect to emitted light emitted from a light source S transmitted through the pattern-glass 100.

Moreover, since a specific configuration of the solar cell 200 converting light energy into electric energy is the same as a solar or photoelectric cell according to the related art, a detailed description is omitted.

Here, the light source S may be the sun, and the solar cell 200 may convert solar energy of the sun is converted into electrical energy.

A configuration in which the pattern-glass 100 is coupled to the solar cell 200 may be changed according to a specific structure in which the solar cell 200 is provided.

For example, the pattern-glass 100 of the solar light power generating module according to an embodiment of the present disclosure is provided in parallel with a side wall of a building provided with the solar cell 200.

In other words, when the solar cell 200 is coupled to a side wall of a building, the pattern-glass 100 may also be vertically coupled to the side wall of the building (see (a) of FIG. 1).

Furthermore, when the solar cell 200 is coupled to a sloping roof of a building, the pattern-glass 100 may also be inclinedly coupled to the roof (see (b) of FIG. 1). Moreover, when a roof of the building is horizontal, the pattern-glass 100 may also be horizontally coupled to the roof of the building (not shown).

Moreover, an angle range a1 of a transmission area formed by the pattern-glass 100 and an angle range a2 of a reflection area may be changed according to a change of such a coupling angle, but, in this case, the regions may be divided based on the reference line CL.

FIG. 2 is a cross-sectional view illustrating a pattern-glass 100 according to an embodiment of the present disclosure, FIG. 7 is a cross-sectional view illustrating paths (from the perspective of the observer, a direction of the vision is opposite to the vision light, so the arrow is reversed) of emitted light from the light source S and vision light transferred to an observer E in the pattern-glass 100 according to an embodiment of the present disclosure, and FIG. 9 illustrates a simulation result divided into a transmission area and a reflection area by the pattern-glass 100 according to an embodiment of the present disclosure.

Referring to the drawings, the pattern-glass 100 according to an embodiment of the present disclosure includes a base plate unit 110 coupled to a support body, and a pattern unit 120 provided in the base plate unit 110, and including a transmission area to which light transmits while an angle, formed between an entrance direction and a deviation direction in a light path formed by the emitted light from a light source S, forms an obtuse angle range, and a reflection area in which an angle, formed between an entrance direction and a deviation direction in a light path of vision light transferred to an observer E, forms an acute angle range so as to have reflectivity bigger than that in the transmission area. Here, the base plate unit 110 and the pattern unit 120 are formed of a transparent material formed with the same refractive index.

As described above, the pattern-glass 100 includes the base plate unit 110 and the pattern unit 120, so transmittance is increased in a region, in which collection of emitted light emitted from the light source S is required, and a shielding rate with respect to vision light transferred to an observer E is increased.

In other words, the pattern unit 120 is provided to form a path with respect to emitted light, emitted by the light source S, as a light path having an angle formed by an initial entrance direction and a final deviation direction in a range of an obtuse angle, and thus a transmission area in which transmittance is greater than the reflection area may be formed.

This is a region which could be confirmed as a light path SR of emitted light above a reference line CL in FIG. 2. Moreover, even when a light path of emitted light above a reference line CL in FIG. 7 is divided into two light paths and an entrance angle is set differently based on the base plate unit 110, it can be seen that an angle formed by the light paths SR1 and SR2 of emitted light with a deviation direction is an obtuse angle.

Meanwhile, the pattern unit 120 is provided to form a path with respect to vision light, transferred to the observer E, as a light path having an angle formed by an initial entrance direction and a final deviation direction in a range of an acute angle, and thus a reflection area in which reflectivity is greater than the transmission area may be formed.

Here, a path of vision light could be indicated as a path along the vision of the observer E, and thus an arrow is indicated as opposed to a vision light path for easy understanding in FIGS. 2, 6, and 7.

Looking at a path along the vision of the observer E, an area which could be confirmed as a path ER of vision below the reference line CL in FIG. 2 is a reflection area. Moreover, even when a path of vision below the reference line CL in FIG. 7 is divided into two paths and an entrance angle is set differently based on the base plate unit 110, it can be seen that an angle, formed between an entrance direction and a deviation direction, of paths ER1 and ER2 of the vision is an acute angle.

The reflection area and the transmission area can be seen in (a) of FIG. 9. That is, it can be an area above based on the reference line CL is a transmission area (blue and green areas) in which reflected light is hardly observed, while an area below based on the reference line CL is a reflection area (red and yellow areas) in which a relatively large amount of reflected light is observed.

In addition, in the pattern unit 120 of the pattern-glass 100 according to an embodiment of the present disclosure, at least one surface of a prism pattern is a curved surface.

In this regard, vision light, flowing in the eyes of the observer E, is dispersed. Thus, it could be configured to observe by increasing the uniformity from the perspective of the observer E. Moreover, emitted light of the light source S, transferred to a solar cell, or the like, could be concentrated and transmitted to improve the energy conversion.

In detail, the uniformity is observed by the observer E by increasing the uniformity of a color even when the pattern-glass 100 includes a color portion 130, to be described later, and thus a more excellent appearance could be provided.

The uniformity can be seen in (b) of FIG. 9. That is, as the pattern unit 120 is formed to have a curved surface, as compared with (a) of FIG. 9, it can be confirmed that vision light, reflected and observed in (b) of FIG. 9, is dispersed and observed.

In more detail, the increase in uniformity of a reflection area as in (b) of FIG. 9 is a result of applying a curved surface by the Bezier curve to a shape of the pattern unit 120 illustrated in FIG. 8.

That is, (a) of FIG. 9 illustrates a simulation result in the case in which the pattern unit 120 is set not to include a curved surface by setting values of WA and WB as "0" in the Bezier curve of FIG. 8. Moreover, (b) of FIG. 9 illustrates a simulation result in the case in which the pattern unit 120 is set to include a curved surface by setting a value of WA as "1.0" and a value of WB as "0.2" in the Bezier curve of FIG. 8. The formation of a curved surface by the Bezier curve will be described later with reference to FIG. 8.

FIG. 3(a) and 3(b) and FIG. 4(a) and 4(b) are cross-sectional views illustrating an example of a pattern-glass 100 according to an embodiment of the present disclosure in which a pattern unit 120 includes a microtubule 122.

Here, FIG. 3(a) and 3(b) illustrate the case in which a basic shape of a pattern unit 120 is symmetrical, while FIG. 4 illustrates the case in which a basic shape of the pattern unit 120 is asymmetrical. In addition, (a) of FIG. 3 and (a) of FIG. 4 illustrate the case before a pattern unit 120 includes a curved surface, while (b) of FIG. 3 and (b) of FIG. 4 illustrate the case in which the pattern unit 120 includes a curved surface.

In addition, FIG. 8 is a cross-sectional view of an example of a pattern unit 120 in a pattern-glass 100 according to an embodiment of the present disclosure, illustrated using the Bezier curve, while FIG. 13 is a cross-sectional view of another example of a pattern unit in a pattern-glass according to an embodiment of the present disclosure, illustrated using the Bezier curve.

In detail, referring to the drawings, the pattern unit 120 in the pattern-glass 100 according to an embodiment of the present disclosure is formed of an elastic material, is provided in an outer surface membrane 121 forming a prism pattern and a region surrounded by the outer surface membrane 121 and the base plate unit 110, and may include a microtubule 122 provided with a filling fluid in a gap with the outer surface membrane 121.

According to this configuration, the pattern unit 120 may adjust the transmission area and the reflection area while changing a shape thereof.

That is, as illustrated in (a) of FIG. 3, the pattern unit 120 is provided from a common symmetric shape to an asymmetric shape as in (b) of FIG. 3.

Due to the deformation of the shape, it is provided that transmittance of emitted light of the light source S entering above the reference line CL is increased, and reflectivity of vision light transferred to the eyes of the observer E observing below the reference line CL is increased.

Moreover, it is deformed to include a curved surface during shape deformation of the pattern unit 120, and thus uniformity of vision light observed by the observer E is increased, so the more excellent observation may be possible.

Here, for shape deformation of the pattern unit 120, a supply pressure of an inflow fluid flowing to the microtubule 122 is adjusted.

That is, in the microtubule 122 of the pattern-glass 100 according to an embodiment of the present disclosure, an inflow fluid having the same properties as the filling fluid is provided therein to flow, and a supply pressure of the inflow fluid is adjusted and the inflow fluid is supplied to deform a shape of a curved surface of the outer surface membrane 121.

As described above, when the supply pressure is adjusted to supply an inflow fluid at a positive pressure higher than a pressure of a filling fluid between the outer surface membrane 121 and the microtubule 122, a portion of the pattern unit 120 provided with the microtubule 122 is swollen to deform a shape thereof. On the other hand, when an inflow fluid is supplied at a negative pressure lower than a pressure of a filling fluid between the outer surface membrane 121 and the microtubule 122, a portion of the pattern unit 120 provided with the microtubule 122 is contracted to deform the shape thereof.

In this case, it is preferable to provide the filling fluid provided between the outer surface membrane 121 and the microtubule 122, the inflow fluid supplied to the microtubule 122, and a material forming the outer surface membrane 121 and the microtubule 122 as a material having the same properties such as the same refractive index because it is simple to control the reflection area and the transmission area.

In addition, the material forming the outer surface membrane 121 and the microtubule 122 is provided as an elastic material, and is thus provided to allow the shape deformation of the pattern unit 120. For example, the outer surface membrane 121 and the microtubule 122 may be formed of the same material, such as a polymer synthetic resin.

In addition, the microtubule 122 may be provided in a plurality of microtubules to perform the shape control of the pattern unit 120 more finely.

That is, the microtubule 122 of the pattern-glass 100 according to an embodiment of the present disclosure is inscribed with a region surrounded by the outer surface membrane 121 and the base plate unit 110 to be provided as a plurality of microtubules.

By providing the plurality of microtubules 122, a shape of the pattern unit 120 could be adjusted due to contraction and expansion according to a position of the microtubule 122 provided between the outer surface membrane 121 and the base plate unit 110, and thus a shape could be controlled more finely.

Thus, the pattern-glass 100 according to an embodiment of the present disclosure may change a shape of the pattern unit 120 to correspond to a change in a vision angle of the observer E or a change in a light emission angle of the light source S.

Moreover, the pattern unit 120 in the pattern-glass 100 according to an embodiment of the present disclosure includes a microtubule 122 provided in an outer surface membrane 121 forming a prism pattern in a fixed form and a region surrounded by the outer surface membrane 121 and the base plate unit 110, and provided with a filling fluid in a gap with the outer surface membrane 121, while the microtubule 122 changes a refractive index of an inflow fluid flowing inside and supplies the inflow fluid to adjust a range of the transmission area and the reflection area.

That is, in the pattern unit 120, while a shape of the outer surface membrane 121 is not deformed, a refractive index of an inflow fluid flowing in the microtubule 122 is only different.

In other words, according to the distribution of a refractive index to be formed by the pattern unit 120, an inflow fluid, flowing in the microtubule 122, is supplied as a fluid having a different refractive index.

The microtubule 122 is provided as a plurality of microtubules between the outer surface membrane 121 and the base plate unit 110 to supply inflow fluids having different refractive indices to respective regions having the microtubule 122, so the distribution of refractive indices may be set differently.

Moreover, in the pattern unit 120 of the pattern-glass 100 according to an embodiment of the present disclosure, an asymmetric prism pattern is provided.

Due to the formation of an asymmetric shape of the pattern unit 120 described above, it is provided that transmittance of emitted light of the light source S entering above the reference line CL is increased, and reflectivity of vision light transferred to the eyes of the observer E observing below the reference line CL is increased.

In addition, the pattern unit 120 is provided to include a curved surface while forming an asymmetric prism pattern, thereby increasing the uniformity by dispersing the vision light transferred to the observer E. Moreover, the emitted light of the transmitted light source S is concentrated to increase the efficiency of producing electrical energy in the solar cell 200.

First, to increase the uniformity by dispersing the vision light, the pattern unit 120 may include a connection surface portion 123 and a short side surface portion 125.

That is, the pattern unit 120 of the pattern-glass 100 according to an embodiment of the present disclosure may include a connection surface portion 123 coupled to the base plate unit 110, and in which the emitted light flows, and a short side surface portion 125 connected to the connection surface portion 123, forming the reflection area of the prism pattern, and having a shape of a convex curved surface.

Here, a direction in which the vision light (only a direction is opposite to a path of vision of the observer E, and a formation path is the same) enters is the connection surface portion 123, while the vision light, passing through the connection surface portion 123, is reflected by the short side surface portion 125 of a reflection area.

Thus, since a surface of the short side surface portion 125 is provided to have a concave shape (that is, playing a role opposite to a convex shape) in a direction with which the vision light is in contact, the vision light is distributed to be transferred to the observer E. Thus, the light observed by the observer E is transferred in the form in which the uniformity is improved.

Meanwhile, for concentration of the emitted light of the light source S, the pattern unit 120 may further include a long side surface portion 124 in addition to the connection surface portion 123 and the short side surface portion 125.

In other words, the pattern unit 120 of the pattern-glass 100 according to an embodiment of the present disclosure may include a long side surface portion 124 connected to the connection surface portion 123 and the short side surface portion 125, forming the transmission area having a prism pattern, and having a shape of a concave surface.

Here, a direction to which emitted light of the light source S enters is the connection surface portion 123, and the emitted light, passing through the connection surface portion 123, passes through the long side surface portion 124 of the transmission area.

Thus, since a surface of the long side surface portion 124 has a convex shape (that is, playing a role opposite to a concave shape) in a direction with which the emitted light is in contact, the emitted light is concentrated and passes through the pattern unit 120. Thus, the emitted light, transferred to the solar cell 200, is concentrated, so the electric energy production efficiency of the solar cell 200 is increased.

To provide optimized shapes of the curved surfaces of the long side surface portion 124 and the short side surface portion 125, the pattern unit 120 may have a form in the Bezier curve.

That is, in the pattern unit 120 of the pattern-glass 100 according to an embodiment of the present disclosure, a shape of a prism pattern is formed in the Bezier curve with the numerical values below (see FIG. 8).

$0.04 \geq A1 \geq 0.1$, $0.02 \geq B1 \geq 0.03$
$0 < H1 < H3$, $0 < H2 < H3$, $0.02 \geq H3 \geq 0.04$
$0 < A2 < A1$, $0 < B2 < B1$
$0 < WA \geq 1$, $0 < WB \geq 1$ These numerical values may be presented in specific numerical ranges as follows.

$H1 = 0.024$ to $0.26$, $H2 = 0.047$ to $0.049$, $H3 = 0.032$ to $0.034$
$A1 = 0.074$ to $0.076$, $A2 = 0.014$ to $0.016$
$B1 = 0.024$ to $0.026$, $B2 = 0.0024$ to $0.0026$
$WA = 0.5$ to $1.0$, $WB = 0.2$

Preferably, the Bezier curve may be formed in the following numerical range.

H1=0.025, H2=0.048, H3=0.033
A1=0.075, A2=0.015
B1=0.025, B2=0.0025
WA=1.0, WB=0.2 where H1 is a vertical distance H1 between a first control point C1, forming a shape of the long side surface portion 124, and the connection surface portion 123, H2 is a vertical distance H2 between a second control point C2, forming a shape of the short side surface portion 125, and the connection surface portion 123, and H3 is a vertical distance H3 between a first vertex PH at which the long side surface portion 124 and the short side surface portion 125 are in contact with each other, and the connection surface portion 123.

In addition, A1 is a distance A1 between an origin point O, at which a vertical line, connected to the first vertex PH, intersects the connection surface portion 123, and a second vertex PA at which the long side surface portion 124 and the connection surface portion 123 are in contact with each other, and A2 is a distance A2 between the origin point O, and a point C1A, at which a vertical line, connected to the first control point C1, intersects the connection surface portion 123.

In addition, B1 is a distance B1 between the origin point O, and a third vertex PB, at which the short side surface portion 125 and the connection surface portion 123 are in contact with each other, and B2 is a distance B2 between the origin point O, and a point C2B, at which a vertical line, connected to the second control point C2, intersects the connection surface portion 123.

In addition, WA is a rate WA at which a straight line, connecting the first vertex PH and the second vertex PA, is drawn to the first control point C1, and WB is a rate WB at which a straight line, connecting the first vertex PH and the third vertex PB, is drawn to the second control point C2.

In addition, H1, H2, H3, A1, A2, B1, and B2 are dimensionless numerical values of distances only including respective comparison ratios, and WA and WB are dimensionless numerical values with respect to the ratio being drawn.

Alternatively, the long side surface portion 124 may form a shape of the pattern unit 120, not forming a shape of a curved surface, using the Bezier curve.

That is, in the pattern unit 120 of the pattern-glass according to an embodiment of the present disclosure, a shape of a prism pattern is formed in the Bezier curve with the numerical values below (see FIG. 13).

0.1≥A1≥0.25, 0.03≥B1≥0.05
H1=H3, 0<H2≥H3, 0.03≥H3≥0.1
0.02<A2≥0.05, 0<B2≥B1
WA=1, 0<WB≥1

These numerical values may be presented in specific numerical ranges as follows.

H1=0.092 to 0.094, H2=0.079 to 0.081, H3=0.092 to 0.094
A1=0.125 to 0.127, A2=0.041 to 0.043
B1=0.037 to 0.039, B2=0.0377 to 0.0379
WA=1.0, WB=0.57

Preferably, the Bezier curve may be formed in the following numerical range.

H1=0.0932914, H2=0.08, H3=0.0932914
A1=0.12615, A2=0.0421341
B1=0.03785, B2=0.03785
WA=1.0, WB=0.57

In addition, an example in which the long side surface portion 124 is formed to have a linear shape in FIGS. 10 and 11, while FIG. 12 illustrates a simulation result of a light path according to FIG. 11.

That is, FIG. 10 is a cross-sectional view illustrating an example in which, in a pattern-glass 100 according to an embodiment of the present disclosure, a long side surface portion 124 is formed to have a linear shape, and the entirety of a short side surface portion 125 is formed to have a curved surface shape, FIG. 11 is a cross-sectional view illustrating an example in which, in a pattern-glass 100 according to an embodiment of the present disclosure, a long side surface portion 124 is formed to have a linear shape, and a portion of a short side surface portion 125 includes a linear shape, and FIG. 12 is a cross-sectional view illustrating a path of emitted light from a light source or vision light transferred to an observer according to the example of FIG. 11.

First, referring to FIG. 10, an example will be described as follows, and the pattern unit 120 of the pattern-glass 100 according to an embodiment of the present disclosure may include a connection surface portion 123 coupled to the base plate unit 110, and in which the emitted light flows, a short side surface portion 125 connected to the connection surface portion 123, forming the reflection area of a prism pattern, and having a convex shape, and a long side surface portion 124 connected to the connection surface portion 123 and the short side surface portion 125, forming the transmission area of the prism pattern, and having a concave shape, while the long side surface portion 124 may include a first long side surface 124a provided to have a linear shape connected to the connection surface portion 123 and a second long side surface 124b provided to have a straight line, connecting the first long side surface 124a and the short side surface portion 125, and forming an external angle, formed with the first long side surface 124a, as an obtuse angle.

In other words, an example is presented, in which the long side surface portion 124 is formed to have a linear shape while the short side surface portion 125 is formed to have a curved line shape.

As described above, when the long side surface portion 124 is formed to have a linear shape, while the pattern unit 120 is formed to include a transmission area and a reflection area, the long side surface portion 124 may be easily manufactured.

In addition, the long side surface portion 124 is provided to have a concave recessed form while the first long side surface 124a and the second long side surface 124b are provided to have a straight line. Thus, in a manner similar to the long side surface portion 124 in the form of a concave curved surface described previously, the electrical energy production efficiency of the solar cell 200 is increased.

Here, the entirety of the short side surface portion 125 of the pattern-glass 100 according to an embodiment of the present disclosure is provided to have a curved surface shape. That is, here, the short side surface portion 125 is provided to have a convex curved surface. Thus, an effect of improving the uniformity of light observed by the observer E due to the short side surface portion 125) is the same.

Meanwhile, referring to FIG. 11, an example will be described as follows, the short side surface portion 125 of the pattern-glass 100 according to an embodiment of the present disclosure may include a first short side surface 125a connected to the second long side surface 124b, and provided to have a linear shape parallel to the connection surface portion 123, a second short side surface 125b connected to the first short side surface 125a, and having a convex curved surface shape, and a third short side surface 125c provided to have a linear shape, connecting the second short side surface 125b and the connection surface portion 123, and forming an external angle, formed with the connection surface portion 123, as an obtuse angle.

In other words, the long side surface portion 124 is provided to have a concave recessed form configured by a straight line including the first long side surface 124a and the second long side surface 124b. Thus, in a manner similar to the long side surface portion 124 in the form of a concave curved surface described previously, an effect of increasing the electric energy production efficiency of the solar cell 200 may be secured, the solar cell may be easily manufactured, and the short side surface portion 125 may also be easily manufactured.

The effect of securing a transmission area and a reflection area according to a modified example of the short side surface portion 125 may be seen in FIG. 12.

First, due to the long side surface portion 124, emitted light from a light source, flowing above about 40 or more above a reference line, is transmitted, thereby preventing a problem of lowering transmittance (see (a) of FIG. 12). Moreover, the long side surface portion 124 serves to increase the reflectivity with respect to vision light coming from below a reference line (see (c) of FIG. 12).

In addition, the first short side surface 125a of the short side surface portion 125 serves to increase the reflectivity with respect to vision light coming from below the reference line. That is, among coming vision light, pieces of vision light, reflected form the third short side surface 125c, is reflected from the first short side surface 125a again to flow the observer, thereby increasing reflectivity (see (d) of FIG. 12).

The second short side surface 125b of the short side surface portion 125 disperses light reflected by the long side surface portion 124, thereby improving the uniformity (see (c) of FIG. 12).

The third short side surface 125c of the short side surface portion 125 has a form forming an external angle, formed with the connection surface portion 123, as an obtuse or right angle, and the external angle, formed with the connection surface portion 123, may be about 93.5 degrees, byway of example (about 86.5 degrees in the case of an internal angle).

The third short side surface 125c reflects most of vision light coming from below a reference line, thereby serving to increase the reflectivity of the vision light, reaching an observer (see (d) of FIG. 121).

FIGS. 5 and 6 are cross-sectional views illustrating an example in which a pattern-glass 100 according to an embodiment of the present disclosure includes a color portion 130. Referring to FIGS. 5 and 6, the pattern-glass 100 according to an embodiment of the present disclosure may include a color portion 130 provided in the pattern unit 120, and provided to adjust a transmission wavelength of light.

Here, FIG. 5 illustrates an example in which the color portion 130 is provided in a pattern unit 120 and a base plate unit 110, while FIG. 6 illustrates an example in which the color portion 130 is provided on one surface of the pattern unit 120.

As described above, the pattern-glass 100 according to an embodiment of the present disclosure includes the color portion 130, so the pattern-glass may be provided to allow the observer E to observe the pattern-glass by including a color when the observer observes the pattern-glass.

According to the related art, the color portion 130 in the pattern-glass 100 according to an embodiment of the present disclosure is provided between the base plate unit 110 and the pattern unit 120.

In other words, the color is applied to the entirety of the pattern-glass 100, so the observer E, observing the pattern-glass below the reference line CL, is allowed to observe the pattern-glass while the color is applied.

However, if the color portion is provided in the entirety of the pattern-glass 100, emitted light of a certain wavelength of the light source S transferred to the solar cell 200 only passes, so the electric energy production efficiency by the solar cell 200 may be lowered.

Thus, in an embodiment of the present disclosure, the color portion 130 is only applied to the reflection area, observed by the observer E, and may be configured not to affect the transmission area transferring emitted light to the solar cell 200.

That is, the color portion 130 in the pattern-glass 100 according to an embodiment of the present disclosure is only provided on one tapered surface of the pattern unit 120 forming the reflection area in the pattern unit 120.

In other words, the color portion 130 is only applied to one surface forming the reflection area, and may be configured not to affect the transmission area of the emitted light transferred to the solar cell 200.

For example, the color portion 130 is only applied to the short side surface portion 125 described previously, while the color portion 130 is not applied to the long side surface portion 124. Accordingly, the color is given to the observer E, and a transmission wavelength of emitted light, transferred to the solar cell 200, is not limited.

While the present disclosure has been shown and described with reference to exemplary embodiments thereof in particular, the present disclosure is not limited thereto. It will be readily apparent to those skilled in the art that various changes and modifications thereof may be made within the spirit and scope of the present disclosure, and therefore to be understood that such changes and modifications belong to the scope of the appended claims.

The invention claimed is:

1. A pattern-glass, comprising:
a base plate unit coupled to a support body; and
a pattern unit provided in the base plate unit, and including a transmission area to which light transmits while an angle, formed between an entrance direction and a deviation direction in a light path formed by emitted light from a light source, forms an obtuse angle range, and a reflection area in which an angle, formed between an entrance direction and a deviation direction in a light path of vision light transferred to an observer, forms an acute angle range so as to have reflectivity bigger than that in the transmission area,
wherein the pattern unit includes:
an outer surface membrane forming a prism pattern in a fixed form; and
a microtubule provided in a region surrounded by the outer surface membrane and the base plate unit, and provided with a filling fluid in a gap with the outer surface membrane, and the microtubule adjusts ranges of the transmission area and the reflection area, by changing a refractive index of an inflow fluid flowing inside and supplying the inflow fluid,
wherein the microtubule is provided as a plurality of microtubules between the outer surface membrane and the base plate unit to supply inflow fluids having different refractive indices to respective regions having the microtubule, so a distribution of refractive indices may be set differently.

2. The pattern-glass of claim 1, comprising:
a color portion provided in the pattern unit, and provided to adjust a transmission wavelength of light.

3. The pattern-glass of claim 2, wherein the color portion is provided between the base plate unit and the pattern unit.

4. The pattern-glass of claim 2, wherein the color portion is provided only on one tapered surface of the pattern unit forming the reflection area in the pattern unit.

5. A solar light power generating module, comprising:
the pattern-glass of claim 1; and
a solar cell, the support body, to which the base plate unit is coupled.

6. The solar light power generating module of claim 5, wherein the pattern-glass is provided to be in parallel with a building side wall provided with the solar cell.

* * * * *

UNITED STATES PATENT AND TRADEMARK OFFICE
CERTIFICATE OF CORRECTION

| | | |
|---|---|---|
| PATENT NO. | : 11,784,271 B2 | Page 1 of 1 |
| APPLICATION NO. | : 16/636124 | |
| DATED | : October 10, 2023 | |
| INVENTOR(S) | : Tae-Won Kim et al. | |

It is certified that error appears in the above-identified patent and that said Letters Patent is hereby corrected as shown below:

On the Title Page

Item (73) Assignee:
"POSCO CO., LTD, GYEONGSANGBUK-DO, POHANG-SI, (KR) RESEARCH INSTITUTTE OF INDUSTRIAL SCIENCE & TECHNOLOGY, GYEONGSANGBUK-DO, POHANG-SI (KR)"

Should read:
--POSCO CO., LTD, GYEONGSANGBUK-DO, POHANG-SI, (KR) RESEARCH INSTITUTE OF INDUSTRIAL SCIENCE & TECHNOLOGY, GYEONGSANGBUK-DO, POHANG-SI (KR)--

Signed and Sealed this
Sixteenth Day of September, 2025

Coke Morgan Stewart
*Acting Director of the United States Patent and Trademark Office*